United States Patent
Lin et al.

(10) Patent No.: US 7,400,536 B1
(45) Date of Patent: Jul. 15, 2008

(54) MEMORY SYSTEM AND A VOLTAGE REGULATOR

(75) Inventors: Yufe Feng Lin, Taoyuan County (TW); Yi-Chun Shih, Taipei (TW); Kuen-Long Chang, Taipei (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 11/693,712

(22) Filed: Mar. 30, 2007

(51) Int. Cl.
*G11C 11/34* (2006.01)

(52) U.S. Cl. .................... 365/185.21; 365/205
(58) Field of Classification Search ............ 365/185.21, 365/205
See application file for complete search history.

(56) References Cited

U.S. PATENT DOCUMENTS

| 7,009,882 | B2 * | 3/2006 | Chen ..................... 365/185.18 |
| 2002/0041531 | A1 * | 4/2002 | Tanaka et al. ............... 365/205 |
| 2003/0223289 | A1 * | 12/2003 | Ganivet et al. .............. 365/200 |
| 2004/0057291 | A1 * | 3/2004 | Conte et al. ............ 365/189.09 |
| 2004/0190340 | A1 * | 9/2004 | Chih et al. ............. 365/185.21 |
| 2007/0081389 | A1 * | 4/2007 | Tran et al. .............. 365/185.21 |
| 2007/0115717 | A1 * | 5/2007 | Yang et al. .................. 365/171 |
| 2007/0133250 | A1 * | 6/2007 | Kim ........................... 365/113 |

* cited by examiner

*Primary Examiner*—Michael T Tran
(74) *Attorney, Agent, or Firm*—Akin Gump Strauss Haur & Feld LLP

(57) ABSTRACT

A regulator for regulating a program voltage of a memory device is introduced. The regulator includes an operating amplifier, a program path emulation apparatus, and a current mirror coupled to the program path emulation apparatus and the operating amplifier. The current mirror is for controlling a current flowing in the program path emulation apparatus a multiple of a predetermined current. The program path emulation apparatus includes a bit line selection emulation unit for emulating a bit line selecting unit of the memory device, a path resistor for emulating a program path of a memory cell of the memory device, and a sector selection emulation unit for emulating a sector selecting unit of the memory device. The value of the predetermined current may be varied according to the program times of the memory cells of the memory device.

14 Claims, 2 Drawing Sheets

MEMORY SYSTEM AND A VOLTAGE REGULATOR

BACKGROUND OF THE INVENTION

The present invention generally relates to a memory system, and more particularly, to a voltage regulator of a memory system capable of regulating a voltage, such as a voltage provided to a sector selector of the memory system.

One of the major goals in the development of semiconductor memory devices is to maximize data storage density. Thus, it is desirable to develop memory chips having the small possible physical sizes while storing a substantial amount of data. This has led to the development of memory chips that can store multiple bits of data in a single memory cell, also referred to as multilevel memory chips.

One of the main difficulties in operating multi-level non-volatile memory cells is to accurately program the cells, that is, to provide an accurate voltage with the target value to drain ends of the cells. Many methods and systems for regulating program voltages of memory devices are proposed in the prior art. Examples include U.S. Pat. No. 5,576,990 to Camerlenghi et al., entitled "Voltage Regulator for Non-Volatile Semiconductor Memory Devices,", U.S. Pat. No. 6,275,415 to Haddad et al., entitled "Multiple Byte Channel Hot Electron Programming Using Ramped Gate and Source Bias Voltage,", and United States Publication No. 2006/0114721 A1 naming Frulio et al., entitled "Method and System for Regulating a Program Voltage Value during Multilevel Memory Device Programming." However, prior art schemes for compensating the voltage drop along program paths of memory cells sometime do not provide sufficient speed and sometimes do not consider the effects all the components in the program paths. Moreover, in the example of non-volatile memories, the more times of program shots a memory cell has taken, the higher the threshold voltage of the memory cell is, and the less the program current is required. However, the variation of the program current of the memory cells, which may leads to some problems in programming the memory cells, has not been considered in the regulation method in the prior art.

BRIEF SUMMARY OF THE INVENTION

Examples of the present invention may provide a memory system and a regulator for regulating a voltage provided to a sector selecting unit in a memory device thereof.

One example of the present invention may provide a regulator for regulating a voltage provided to a sector selecting unit in a memory device. The regulator includes an operating amplifier having a first input capable of receiving a reference voltage, a program path emulation apparatus, and a current mirror coupled to the program path emulation apparatus and a second input of the operating amplifier, the current mirror being capable of controlling a current flowing in the program path emulation apparatus a multiple of a predetermined current. The program path emulation apparatus includes a bit line selection emulation unit having an electrical characteristic substantially equal to an electrical characteristic of a bit line selecting unit of a bit line selector of the memory device, a path resistor having a resistance substantially equal to a resistance of a program path of a memory cell of the memory device, and a sector selection emulation unit, coupled to an output of the operating amplifier and sector selecting units of a sector selector of the memory device, having an electrical characteristic substantially equal to an electrical characteristic of a sector selecting unit of the sector selector of the memory device; wherein the bit line selection emulation unit, the path resistor and the sector selection emulation unit are electrically coupled in series.

Another example of the present invention may provide a memory system. The memory system includes a memory device and a regulator for regulating a voltage provided to a sector selecting unit in the memory device. The memory device includes a bit line selector comprising a plurality of bit line selecting unit, a plurality of sector selectors, wherein each sector selector of the plurality of sector selectors comprises a plurality of sector selecting units, and a plurality of sectors, wherein each sector of the plurality of sectors comprises a plurality of memory cells, in which each memory cell is coupled to one of the plurality of bit line selecting units and one of the plurality of sector selecting units of the sector. The regulator includes an operating amplifier having a first input capable of receiving a reference voltage, a program path emulation apparatus, and a current mirror coupled to the program path emulation apparatus and a second input of the operating amplifier, the current mirror being capable of controlling a current flowing in the program path emulation apparatus a multiple of a predetermined current. The program path emulation apparatus includes a bit line selection emulation unit having an electrical characteristic substantially equal to an electrical characteristic of a bit line selecting unit of the bit line selector of the memory device, a path resistor having a resistance substantially equal to a resistance of a program path of a memory cell of the memory device, and a sector selection emulation unit, coupled to an output of the operating amplifier and sector selecting units of a sector selector of the memory device, having an electrical characteristic substantially equal to an electrical characteristic of a sector selecting unit of the sector selector of the memory device; wherein the bit line selection emulation unit, the path resistor and the sector selection emulation unit are electrically coupled in series.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings examples which are presently preferred. It should be understood, however, that the invention is not limited to the precise arrangements and instrumentalities shown.

In the drawings.

DETAILED DESCRIPTION OF THE INVENTION

Reference will now be made in detail to the present examples of the invention illustrated in the accompanying drawings. Wherever possible, the same reference numbers will be used throughout the drawings to refer to the same or like portions.

Figure 1:
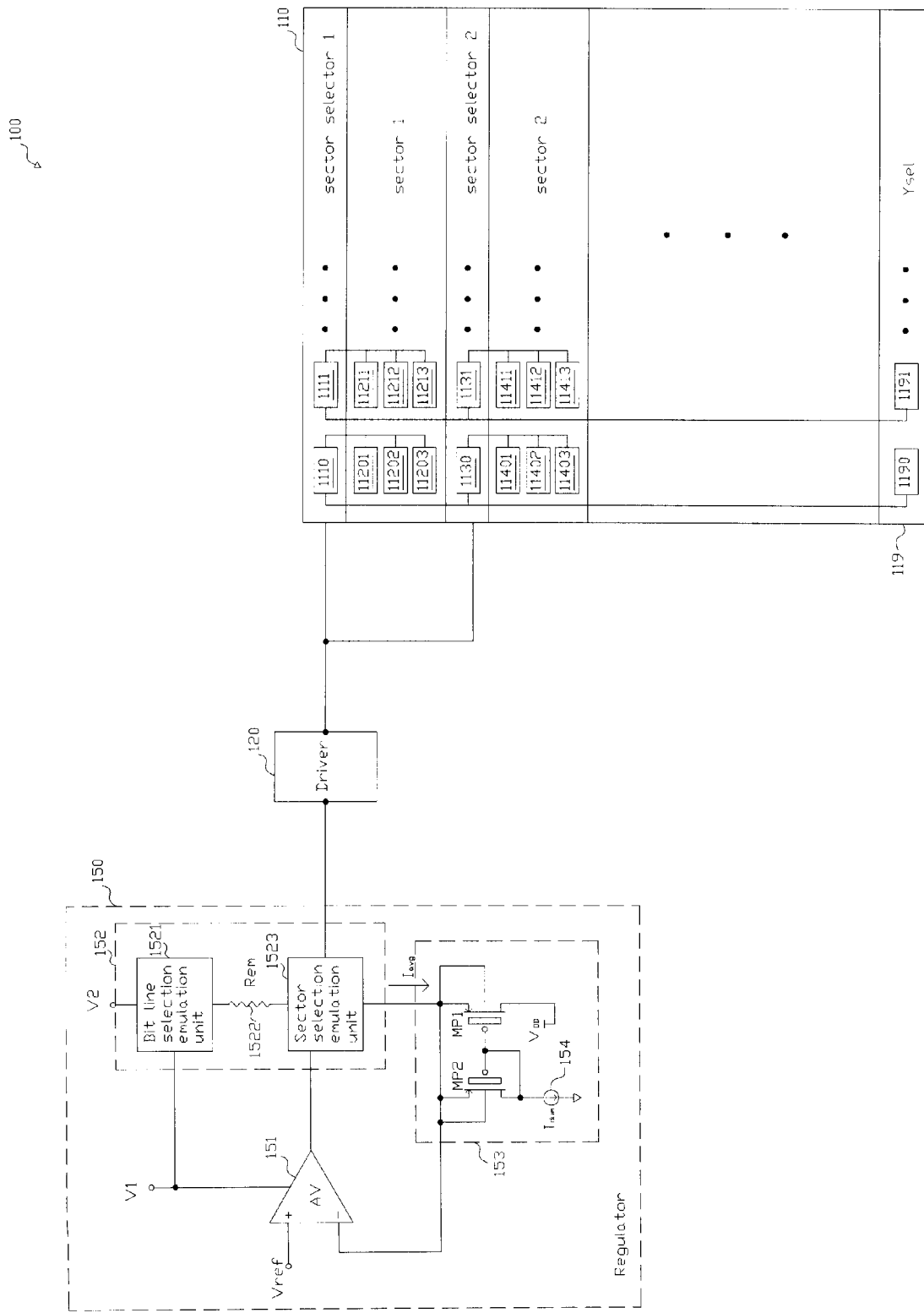
FIG. 1 is a schematic diagram of a memory system consistent with an example of the invention.

FIG. 1 is a schematic diagram of a memory system 100 consistent with an example of the invention. The memory system 100 includes a memory device 110, a sector selector driver 120 and a regulator 150. The memory device 110 is basically a common memory device, including a bit line selector 119, a plurality of sectors, including sector 1, sector 2, etc., and a plurality of sector selectors, including sector selector 1, sector selector 2, etc., each corresponding to one sector, respectively. Each of the sector selectors includes a plurality sector selecting units. For instance, the sector selector 1 includes sector selecting units 1110, 1111, etc., and the sector selector 2 includes sector selecting units 1130, 1131, etc. The bit line selector 119 includes a plurality of bit line selecting units 1190, 1191, etc. Each of the sectors of the memory device 110 includes a plurality of memory cells as shown in FIG. 1, wherein each memory cell is coupled to one of the plurality of bit line selecting units and one of the plurality of sector selecting units of the sector thereof. The bit line selecting units are in charge of selecting a corresponding bit line, and the sector selecting units are in charge of selecting memory cells of a corresponding sector. The memory device further includes a plurality of word line selecting units (now shown in FIG. 1) in charge of turning on memory cells of a corresponding word line (row) of the memory device 110.

Referring to FIG. 1, the regulator 150 is utilized to regulate a voltage provided to sector selecting units in the memory device 110 by providing power to the sector selector driver 120. The regulator 150 comprises a gain stage provided by an operational amplifier 151 and a source follower coupled to the operational amplifier 151 in cascade. As illustrated in FIG. 1, the regulator 150 includes an operating amplifier 151, a program path emulation apparatus 152, and a current mirror 153. The program path emulation apparatus 152 includes a bit line selection emulation unit 1521, a path resistor 1522, and a sector selection emulation unit 1523, wherein the three components are coupled in series as illustrated in the example shown in FIG. 1. The operating amplifier 151 is further coupled to a reference voltage Vref by another input, and is provided with a voltage source V1, while the program path emulation apparatus 152 is provided with another voltage source V2. The two voltage sources V1 and V2 are not necessarily equal or different to each other. The bit line selection emulation unit 1521 is for emulating the bit line selecting unit in a program path for a memory cell of the memory device 110 by having an electrical characteristic substantially equal to an electrical characteristic of the bit line selecting units 1190 and 1191 of the memory device 110. The path resistor 1522 is for emulating a program path of a memory cell by having a resistance Rem substantially equal to a resistance of the program path of the memory cell of the memory device 110. The sector selection emulation unit 1523 is for emulating a sector selecting unit in a program path for a memory cell of the memory device 110 by having an electrical characteristic substantially equal to an electrical characteristic of the sector selecting unit of the sector selector of the memory device 110. The sector selection emulation unit 1523 is coupled to the driver 120 for implementing the regulation of the sector selecting units. The current mirror 153 is coupled to the program path emulation apparatus 152 and an input of the operating amplifier 151. The current mirror 153, composed of two P-type MOS MP1 and MP2, and a current source 154, is capable of controlling a current $I_{avg}$ flowing in the program path emulation apparatus 152, which is substantially equal to an average current value flowing on a program path of a memory cell of the memory device 110, a multiple of a predetermined current value, that is, in the example illustrated in FIG. 1, the current value $I_{dum}$ of a current source 154.

It is noted that the utilization of the program path emulation apparatus 152 tracks the sizes, the characteristics, and the variation of components of the program path, removing the difference between the real program path of a memory cell and the emulated path in the regulating device, helping to regulate the control voltage more correctly, and improving the accuracy of programming the memory cells.

Further, in the current mirror 153 of the regulator 150, the current flowing on the PMOS MP1 is recycled by coupling the drain end of MP1 to the voltage source $V_{DD}$. Therefore, with an appropriate design, the current value $I_{dum}$ of the current source 154 may be a small fraction of the emulated current $I_{avg}$ flowing on the program path emulation apparatus 152, that is, the average current flowing on a program path of a memory cell of the memory device 110. For example, if a size of the transistor MP1 is 9 times a size of the transistor MP2, there is only one tenth of the average current $I_{avg}$ required for a program path of a memory cell is wasted or consumed in the regulator 150, while the other 9/10 of the average current $I_{avg}$ is recycled.

Moreover, the more times of program shots a memory cell has taken, the higher the threshold voltage of the memory cell is, and the less the program current is required. Therefore, it is necessary to consider about the variation of the program current of the memory cells for an accurate regulation. In the present invention, it is allowed to tune the regulator, that is, to tune the current $I_{avg}$ flowing on the program path emulation apparatus 152 according to the actual required program, which is affected by the program times of the memory cells, by tuning the value $I_{dum}$ of the current source 154. A stepping current source or any current source that is able to tune the current value according to the required program current of the memory device may be utilized in the regulator 150 of the present invention. The consideration of the variation of the program current of the memory cells may sharpen the present regulation.

Figure 2:
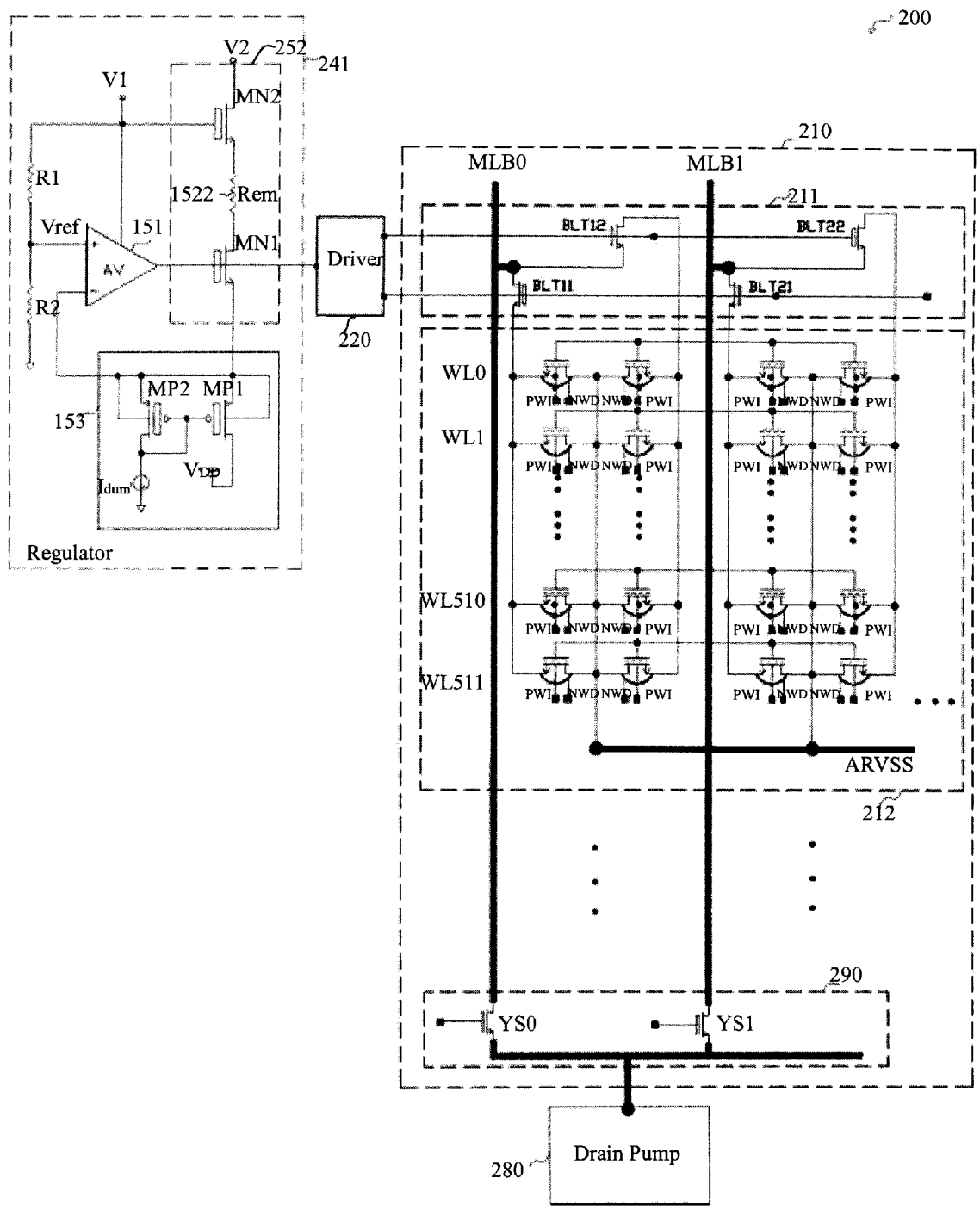
FIG. 2 is a schematic diagram of a memory system consistent with another example of the invention.

FIG. 2 is a schematic diagram of a memory system 200 consistent with an example of the invention. The memory system 200 includes a memory device 210, a driver 220 and a regulator 250. In the example illustrated in FIG. 2, the implementation of the components adopted in the memory device 210 are shown. The memory device 210 includes a bit line selector 290, a plurality of sectors (while only one sector 212 is shown in FIG. 2), and a plurality of sector selectors (while only one sector selector 211 is shown in FIG. 2), each corresponding to one of the sectors, respectively. The bit line selector 290 includes a plurality of bit line selecting units YS0, YS1, etc., each of which includes a transistor in the example. Each of the sectors of the memory device 210 includes a plurality of memory cells as shown in FIG. 2, wherein each memory cell is coupled to one of the plurality of bit line selecting units and one of the plurality of sector selecting units of the sector thereof.

Referring to FIG. 2, the regulator 250 is similar to the regulator 150 illustrated in FIG. 1, utilizing a transistor MN1 for emulating the sector selecting unit and a transistor MN2 for emulating the bit line selecting unit of the memory device 210. The transistor MN2 is for emulating the bit line selecting unit in a program path for a memory cell of the memory device 210 by having a size substantially equal to a size of a bit line selecting unit, for example, the transistor YS0 or YS1, of the bit line selector 290 of the memory device 210, in order to provide a similar electrical characteristic for the emulation. Similarly, the transistor MN1 is for emulating a sector selecting unit in a program path for a memory cell of the memory device 210 by having a size substantially equal to a size of a sector selecting unit, for example, the transistors BLT11 and BLT12, of a sector selector 211 of the memory device 210. The sector selection emulation transistor MN1 is coupled to the driver 220 for providing power to the driver 120, and the driver 220 is further coupled to each of the sector selecting units of the sector selectors for providing a regulated gate voltage for programming the memory cells accurately.

As illustrated, the present invention may provide a memory system and a regulating device capable of regulating a voltage provided to a sector selector of the memory device. The bit line selector/bit line selecting unit is considered in the regulation scheme of the present invention. The variation of the program current due to the multiple programming is included by utilizing a variable and controllable current source in the current mirror in the regulation device. Furthermore, most of the current required in the regulation scheme is recycled for a power efficient design. Examples of the invention may dynamically change the operation parameters, such as the operational voltage and current values, according to the characteristics and design of the memory cells of the memory system or, in some examples, based on the programming schemes of the memory system. The present invention may be applied to various memory configurations, such as a NOR memory configuration.

In describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

We claim:

1. A regulator for regulating a voltage provided to a sector selecting unit in a memory device, the regulator comprising:
   an operating amplifier having a first input capable of receiving a reference voltage;
   a program path emulation apparatus, comprising:
      a bit line selection emulation unit having an electrical characteristic substantially equal to an electrical characteristic of a bit line selecting unit of a bit line selector of the memory device;
      a path resistor having a resistance substantially equal to a resistance of a program path of a memory cell of the memory device; and
      a sector selection emulation unit, coupled to an output of the operating amplifier and sector selecting units of a sector selector of the memory device, having an electrical characteristic substantially equal to an electrical characteristic of a sector selecting unit of the sector selector of the memory device;
   wherein the bit line selection emulation unit, the path resistor and the sector selection emulation unit are electrically coupled in series; and
   a current mirror coupled to the program path emulation apparatus and a second input of the operating amplifier, the current mirror being capable of controlling a current flowing in the program path emulation apparatus a multiple of a predetermined current.

2. The regulator of claim 1, wherein each of the bit line selecting units of the bit line selector of the memory device comprises a transistor, and the bit line selection emulation unit comprises a transistor having a size substantially equal to a size of the transistor of the bit line selecting unit of the bit line selector of the memory device.

3. The regulator of claim 1, wherein the sector selecting unit of the sector selector of the memory device comprises a transistor, and the sector selection emulation unit comprises a transistor having a size substantially equal to a size of the transistor of the sector selecting unit of the sector selector of the memory device.

4. The regulator of claim 1, wherein the current mirror comprises:
   a current source $I_{dum}$;
   a first P-type transistor comprising:
      a gate end;
      a source end coupled to the sector selection emulation unit; and
      a drain end coupled to a voltage source $V_{DD}$; and
   a second P-type transistor comprising:
      a gate end coupled to the gate end of the first P-type transistor;
      a source end coupled to the source end of the first P-type transistor and the second input of the operational amplifier; and
      a drain end coupled to the current source $I_{dum}$;
   wherein a size of the first P-type transistor is a multiple of a size of the second P-type transistor.

5. The regulator of claim 4, wherein the current source $I_{dum}$ is a stepping current source.

6. The regulator of claim 1, wherein the predetermined current is variable and controllable.

7. The regulator of claim 1, wherein the sector selection emulation unit is coupled to sector selecting units of a sector selector of the memory device via a sector selector driver of the memory device.

8. A memory system comprising:
   a memory device comprising:
      a bit line selector comprising a plurality of bit line selecting unit;
      a plurality of sector selectors, wherein each sector selector of the plurality of sector selectors comprises a plurality of sector selecting units; and
      a plurality of sectors, wherein each sector of the plurality of sectors comprises a plurality of memory cells, in which each memory cell is coupled to one of the plurality of bit line selecting units and one of the plurality of sector selecting units of the sector; and
   a regulator for regulating a voltage provided to sector selecting units of the memory device, the regulator comprising:

an operating amplifier having a first input capable of receiving a reference voltage;

a program path emulation apparatus, comprising:

a bit line selection emulation unit having an electrical characteristic substantially equal to an electrical characteristic of a bit line selecting unit of the bit line selector of the memory device;

a path resistor having a resistance substantially equal to a resistance of a program path of a memory cell of the memory device; and a sector selection emulation unit, coupled to an output of the operating amplifier and sector selecting units of a sector selector of the memory device, having an electrical characteristic substantially equal to an electrical characteristic of a sector selecting unit of the sector selector of the memory device;

wherein the bit line selection emulation unit, the path resistor and the sector selection emulation unit are electrically coupled in series; and a current mirror coupled to the program path emulation apparatus and a second input of the operating amplifier, the current mirror being capable of controlling a current flowing in the program path emulation apparatus a multiple of a predetermined current.

9. The memory system of claim 8, wherein each of the bit line selecting units of the bit line selector of the memory device comprises a transistor, and the bit line selection emulation unit of the regulator comprises a transistor having a size substantially equal to a size of the transistor of the bit line selecting unit of the bit line selector of the memory device.

10. The memory system of claim 8, wherein the sector selecting unit of the sector selector of the memory device comprises a transistor, and the sector selection emulation unit of the regulator comprises a transistor having a size substantially equal to a size of the transistor of the sector selecting unit of the sector selector of the memory device.

11. The memory system of claim 8, wherein the current mirror of the regulator comprises:

a current source $I_{dum}$;

a first P-type transistor comprising:

a gate end;

a source end coupled to the sector selection emulation unit; and a drain end coupled to a voltage source $V_{DD}$; and a second P-type transistor comprising:

a gate end coupled to the gate end of the first P-type transistor;

a source end coupled to the source end of the first P-type transistor and the second input of the operational amplifier; and a drain end coupled to the current source $I_{dum}$;

wherein a size of the first P-type transistor is a multiple of a size of the second P-type transistor.

12. The memory system of claim 11, wherein the current source $I_{dum}$ of the current mirror of the regulator is a stepping current source.

13. The memory system of claim 8, wherein the predetermined current is variable and controllable.

14. The memory system of claim 8 further comprising a sector selector driver, wherein the sector selection emulation unit of the regulator is coupled to sector selecting units of the memory device via the sector selector driver.

* * * * *